ELECTRIC CONNECTING PLANES OF COMPOSITE METAL HAVING A SILVER ALLOY LAYER

Filed Sept. 26, 1967

INVENTORS
CHOICHIRO TAKAHASHI, KENKICHI YAMAJI
HIROO NAGANO, ISSEI NAKANISHI
YASUHIKO MIYAKE

BY Craig & Antonelli
ATTORNEYS

United States Patent Office 3,598,550

Patented Aug. 10, 1971

3,598,550

ELECTRIC CONNECTING PLANES OF COMPOSITE METAL HAVING A SILVER ALLOY LAYER

Choichiro Takahashi, Kenkichi Yamaji, Hiroo Nagano, Issei Nakanishi, and Yasuhiko Miyake, Hitachi-shi, Japan, assignors to Hitachi Cable, Ltd., Tokyo, Japan Filed Sept. 26, 1967, Ser. No. 670,633
Claims priority, application Japan, Dec. 28, 1966, 41/85,292
Int. Cl. B32b *15/00*
U.S. Cl. 29—199 2 Claims

ABSTRACT OF THE DISCLOSURE

An electric connecting plane comprising a base of conductive material such as copper, copper alloy, aluminum or aluminum alloy, and a clad material comprising a surface conductive layer, an intermediate conductive layer and a solder layer, cladded integrally with each other in superposed relation, and bonded to the surface of said base with heat and pressure, said surface conductive layer being formed of a material such as silver or silver alloy having a small contact resistance and being highly resistive against corrosion, said intermediate conductive layer being formed of a material such as copper, copper alloy, aluminum or aluminum alloy having a good electric conductivity, and said solder layer being formed of a composition solderable to either of copper-type and aluminum-type metals; and a method of forming said electric connecting plane comprising producing the clad material of the composition described, cleaning the bonding surfaces of said clad material and said base either mechanically or chemically and bonding the cleaned surfaces of said clad material and said base to each other with heat and pressure.

BACKGROUND OF THE INVENTION

Field of the invention

The present invention relates to improvements in the electric connecting plane.

Description of the prior arts

Electric connecting planes of the type which makes contact in a stationary or sliding state, are applied, for example, to the connecting portion or plug-in portion of flat bars, channel bus bars and bus duct conductors, the terminals of various conductors, the connecting portion of circuit breakers, the plug-in portion of bus ducts and the switching portion of circuit breakers, which are made of copper, copper alloy, aluminum or aluminum alloy.

Such electric connecting planes preferably have a minimum contact resistance and are required not to have its resistance increasing or to generate heat during use. It is well known to form a zinc layer or a silver plating layer on the surface of a copper or aluminum base after cleaning said surface, or to coat said surface with a current-conducting compound, or to provide on said surface a composite material layer consisting of copper and aluminum, copper and silver, or copper and zinc, for the purpose of minimizing the contact resistance of an electric connecting plane.

In any event, a metal provided on the surface of a base is selected from those which have a small contact resistance and a good conductivity.

For instance, an aluminum or aluminum alloy base, when used as such as an electric connecting plane, gives a high contact resistance and induces troublesome problems, such as generation of heat, because the surface thereof is covered by a tight film of oxide. To prevent increase of the contact resistance, there has been employed a method in which a silver plating layer is formed on the surface of the aluminum base after removing the oxide film from said surface by means of a wire brush, or a method in which the surface is coated with a compound capable of electric connection.

However, the latter method is unsatisfactory in that the characteristics of the compound are subjected to change over a prolonged period, and is not applicable to such electric connecting planes which are engaged and disengaged frequently, though it is most simple and is advantageous economically. The former method, on the other hand, has the drawback that it requires a large scale of production facility and a large number of man-hours, and therefore is extremely costly, although it has many advantages such as that silver is highly resistive against corrosion per se and that the electric connecting plane produced has a small contact resistance due to the fact that oxides and sulfides of silver are electrically conductive. This is because of the following reason. Namely, the electric connecting plane, as shown in FIG. 1 of the accompanying drawings, is composed of a zincate layer 21, a copper plating layer 22 and a silver plating layer 23, arranged in that order in superposed relation on the surface 11 of an aluminum base 10, and where the aluminum base is a casting, satisfactory quality control of the platings formed is occasionally impracticable due to the pin holes present on the surface thereof. That is to say that, since the surface 11 of the aluminum base 10 is rugged sharply as at 12 in FIG. 2, particularly when it is viewed through microscope, hydrogen gas or alkali trapped in the concaves 13 of the rugged surface of aluminum base, as a result of pre-treatment of said surface with a strong acid or alkali before the plating operations, frequently presents a direct cause of blister or peeling of the platings when the hydrogen gas is expanded or the acid or alkali remaining in said concaves generates hydrogen gas upon dissolution of the aluminum or zinc therein.

SUMMARY OF THE INVENTION

The present invention has been achieved with a view to eliminating the foregoing technical problems possessed by the conventional electric connecting planes.

It is an object of the present invention to provide an electric connecting plane which is easy to produce and easy to mount, and which has a small electric resistance.

It is another object of the present invention to provide an electric connecting plane which is simple in construction, which has an invariable contact resistance and does not generate heat throughout a period of conducting a current therethrough, and which is durable for a prolonged use.

Namely, the present invention is directed to:

(1) A clad material suitable for the formation of electric connecting plane, which comprises a surface conductive layer such as of silver or silver alloy having a small contact resistance and a good corrosion resistance; and intermediate conductive layer such as of copper, copper alloy, aluminum or aluminum alloy having a good electric conductivity; and a solder layer of such composition which is solderable to both copper-type and aluminum-type metals or either of them, all of said layers being cladded one on another in superposed relation.

(2) An electric connecting plane which comprises a current-conducting base such as of copper, copper alloy, aluminum or aluminum alloy; and a clad material comprising a surface conductive layer such as of silver or silver alloy having a small contact resistance and a good corrosion resistance, an intermediate conductive layer, such as of copper, copper alloy, aluminum or aluminum alloy having a good electric conductivity and a solder layer of such composition which is solderable to both copper-type and aluminum-type metals or either of them, all of said layers being cladded one on another in superposed relation, and bonded to the surface of said base at the solder layer side thereof.

(3) A method of forming an electric connecting plane, comprising cladding a surface conductive layer such as of silver or silver alloy having a small contact resistance and a good corrosion resistance, an intermediate conductive layer such as of copper, copper alloy, aluminum or aluminum alloy having a good electric conductivity and a solder layer of such composition which is solderable to both copper-type and aluminum-type metals or either of them, one on another in superposed relation to form a clad material; cleaning the exterior surface of the solder layer of said clad material with such a chemical as trichlene; cleaning the cooperating surface of a separately provided current-conducting base either mechanically by means such as of a wire brush or chemically by means of such a chemical as trichlene, said base being formed of copper, copper alloy, aluminum or aluminum alloy; and thereafter bonding said clad material to the cleaned surface of said current-conducting base by closely contacting and melt-bonding the cleaned surface of the solder layer therewith with heat and pressure.

(4) An electric connecting plane comprising a current-conducting base such as of copper, copper alloy, aluminum or aluminum alloy; a clad material comprising a surface conductive layer such as of silver or silver alloy having a small contact resistance and a good corrosion resistance, an intermediate conductive layer such as of copper, copper alloy, aluminum or aluminum alloy having a good electric conductivity, and a solder layer of such composition which is solderable to either of copper-type and aluminum-type metals, all of said layers being cladded one on an other in superposed relation, and bonded to the surface of said base at the solder layer side thereof; and an insulating or conductive anti-corrosive paint layer of a material which is chemically inactive to both of said clad material and said current-conducting base and is water-proof.

(5) An electric connecting plane comprising a current-conducting base such as of copper, copper alloy, aluminum or aluminum alloy; a plurality of clad materials each comprising a surface conductive layer such as of silver or silver alloy having a small contact resistance and a good corrosion resistance, an intermediate conductive layer such as of copper, copper alloy, aluminum or aluminum alloy having a good electric conductivity, and a solder layer of such composition which is solderable to both copper-type and aluminum-type metals or either of them, all of said layers being cladded one on another in superposed relation, and bonded to the surface of said current-conducting base in spaced relation with adjacent clad materials; and an insulating or conductive anti-corrosive paint layer surrounding the edges of said clad materials, said paint layer being formed of a material which is chemically inactive to both of said clad materials and said current-conducting base and is water-proof.

DESCRIPTION OF PREFERRED EMBODIMENTS

Figure 1:
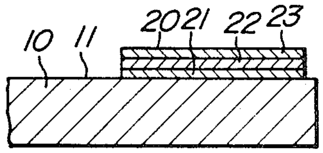
FIG. 1 is a diagrammatic cross sectional view showing the structure of a conventional electric connecting plane formed on an aluminum base.
Figure 2:
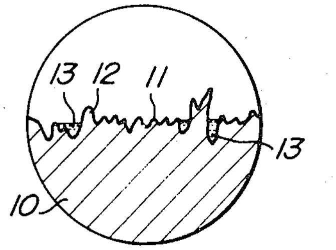
FIG. 2 is a microscope view showing, in section, the surface of aluminum plate.

In the present invention as set forth hereinabove, the surface conductive layer composing the clad material is formed of silver or silver alloy, which has a small contact resistance and is sufficiently resistive against corrosion, or other metal which has properties approximating thereto, because the layer is substantially to provide an electric connecting plane and is constantly exposed to the atmosphere, the thickness of said layer being in the range from 30 to 80$\mu$.

On the other hand, the intermediate conductive layer, which is provided as a reinforcement, is formed of such conductive material as copper or aluminum, or of the other metal which has properties approximating thereto, and its thickness may be on the order of 100 to 300$\mu$ to obtain a satisfactory result, though not restricted particularly. The solder layer is provided for the purpose of bonding the clad material to the current-conducting base and therefore is required to be of such composition which is solderable to both the copper-type and aluminum-type metals or either of them, comprising the intermediate conductive layer and current-conducting base. Compositions to meet such requirement include alloys consisting of 10% Zn-90% Sn, 10% Zn-5% Cd-85% Sn, 20% Zn-10% Cd-70% Sn, 41% Zn-8% Pb-15% Cd-36% Sn and 8% Zn-5% Al-87% Sn. Although not restricted particularly, the thickness of the solder layer on the order of 30 to 100$\mu$ is sufficient for the purpose.

The thickness of the clad material as a whole is variable depending upon the type of the electric connecting plane in which said clad material is used. As an example, a 300$\mu$ thick clad material composed of a 10$\mu$ thick surface conductive layer of silver, a 250$\mu$ thick intermediate conductive layer of copper and a 40$\mu$ thick solder layer of 10% Zn-90% Sn, is suitably used as a stationary connecting plane for aluminum-made bus bars, bus duct conductors and terminals. As another example, a 300$\mu$ thick clad material composed of a 40$\mu$ thick silver layer, a 220$\mu$ thick copper layer and a 40$\mu$ thick aluminum solder layer, is used as a sliding connecting plane for circuit breakers, with satisfactory results.

The term "current-conducting base" as used herein refers to a base element composing an electric connecting plane, which is generally formed of conductive material such as copper, aluminum or zinc, or an alloy thereof.

In forming the connecting plane according to the present invention, by the use of an aluminum plate as the current-conducting base, the oxide film formed on the surface of said base is removed by mechanical means such as brushing or by washing it with a chemical such as trichlene, while at the same time the bonding surface of the solder layer of a clad material to be attached to said base is also cleaned, and thereafter both cleaned surfaces are brought into contact with each other and heated under pressure, whereby the solder layer is melt bonded to the surface of the base, integrating the clad material with the base.

The anti-corrosive paint layer in the present invention is provided for the purpose of preventing possible corrosion of aluminum or zinc material, exposed at the edges of the clad material, due to contact potential difference which is caused by an electrolytic substance attached to the border between the clad material and base which are bonded to each other. Therefore, the anti-corrosive paint to be used for this purpose is only required to be water-proof in its character and it is not of much importance whether the paint is insulating or conductive by having a conductive metal powder blended therein.

Various water-proof paints or grease-like anti-corrosive paints are available. As an example, Eponer #2000 (trade name) or the like, which is an epoxy resin-type paint, has been used with satisfactory results.

Where the area of an electric connecting plane is extremely large, the size of a corresponding clad material becomes large accordingly. Such a large clad material is not only difficult to produce but also tends to be wrinkled at local areas when bonded to a base and further it is disadvantageous economically because the bonding operation requires a large pressurizing and heating apparatus. Such disadvantages may be obviated readily by the use of a plurality of smaller clad materials.

Now, the present invention will be described in further detail with reference to the drawing in which the invention is illustrated by way of example.

Figure 3:
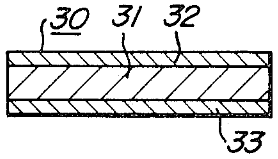
FIG. 3 is a diagrammatic vertical cross sectional view showing the clad material used for the formation of the electric connecting plane of this invention.

Referring to FIG. 3, there is shown, in vertical cross section, a clad material 30 to be used in the formation of the electric connecting plane according to the present invention. As shown, the clad material is composed of an intermediate conductive layer 31 consisting of a 220μ thick copper layer, a surface conductive layer 32 consisting of a 40μ thick silver layer and a solder layer 33 consisting of a 40μ thick layer.

Figure 4:
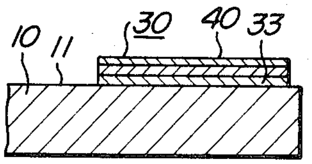
FIG. 4 is a diagrammatic cross sectional view showing an embodiment of the present invention.

In FIG. 4 is shown an electric connecting plane 40 comprising an aluminum base 10 and the clad material 30 of the structure shown in FIG. 3 which is bonded to the surface 11 of said base at the solder layer side thereof.

Figure 5:
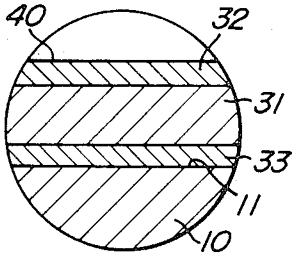
FIG. 5 is an enlarged cross sectional view of a portion of FIG. 4.

FIG. 5 shows a portion of the connecting plane 40 of FIG. 4 in enlargement. As is seen, to the surface 11 of the aluminum base 10 is fastly bonded the solder layer 33, intermediate conductive layer 31 and the surface conductive layer 32 in the order mentioned. The surface of the layer 32 is smooth and hard, and obviously has properties far superior to those of silver plating layer.

Figure 6:
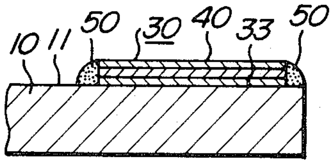
FIG. 6 is a diagrammatic cross sectional view showing another embodiment of the present invention.

FIG. 6 shows another form of the present invention, in which the clad material 30 shown in FIG. 3 is bonded to the surface 11 of the aluminum base 10 at the solder layer 33, to form the connecting plane 40 and the edges of the clad material 30 are surrounded by a water-proof anti-corrosive paint layer 50 consisting of Eponer No. 2000 (trade name). Of course, the material forming the anti-corrosive paint layer 50 is selected from those which are chemically inactive to both of the base 10 and clad material 30.

Figure 7:
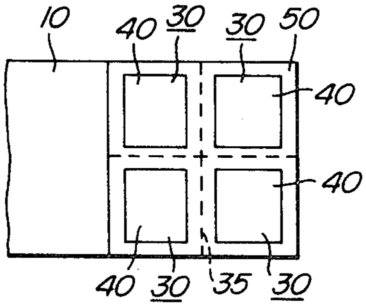
FIG. 7 is a plan view of a modification of the electric connecting plane shown in FIG. 6.
Figure 8:
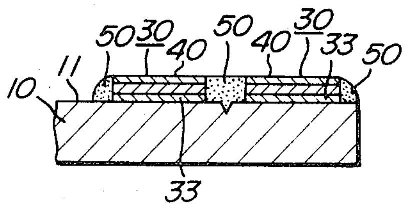
FIG. 8 is a cross sectional view of FIG. 7.

FIGS. 7 and 8 show still another form of the invention, in which the clad material 30 is divided into four pieces because the area of the connecting plane of base 10 is too large. The four clad material pieces 30 are arranged on the surface 11 of base 10 in equally spaced relation with respect to sectioning lines 35 and are bonded integrally to the surface 11 at their respective solder layers 33. The edges of each clad material 30 are surrounded by the conductive anti-corrosive paint layer 50.

The solder layer 33 in each of the embodiments shown has the solidus and liquidus thereof in the range from 199 to 211° C. and a melting point of 226° C. when it is formed of 90% Sn-10% Zn alloy.

A satisfactory bonding between the solder layer 33 of clad material 30 and the surface 11 of base 10 can be obtained by pressing the former against the latter with a pressure within the range of 5 to 30 kg./cm.$^2$ under heated condition.

Although, in the embodiments illustrated hereinabove, the clad material 30 is provided directly on the aluminum or copper base 10, the clade material of the present invention is also applicable, for example, to a copper base having other metal such as zinc or tin thereon. Because, in view of the fact that, in the conventional electric connecting planes, a soft metal such as zinc, lead or tin, or an alloy thereof, is provided thereon to obtain a satisfactory connecting plane, it is quite possible to provide the clad material 30 on such metal.

The embodiments of the present invention are summarized to the following:

(1) An electric connecting plane in which a conductive material having a small contact resistance and an excellent anti-corrosion property, such as a 3 to 10μ thick layer of silver or silver alloy primarily consisting of silver is used as the surface conductive layer of the clad material 30.

(2) An electric connecting plane in which a reinforcement material having a good conductivity, such as a 100 to 400μ three layer of copper, copper alloy, aluminum or aluminum alloy, is used as the intermediate conductive layer of the clad material 30.

(3) An electric connecting plane in which a 20 to 150μ thick layer of an alloy solder selected from the group consisting of Sn, Zn, Pb, Cd and Al alloys is used as the solder layer of the clad material 30.

(4) A clad material suitable for the formation of electric connecting plane, which comprises a surface conductive layer, an intermediate conductive layer and a solder layer, cladded with each other integrally.

(5) An electric connecting plane forming the connecting portion or plug-in portion of flat bars, channel bus bars and bus duct conductors, the current-conducting base of said connecting plane being made of a conductive material such as copper, copper alloy, aluminum, aluminum alloy, zinc or lead, or said metal having other soft metal provided on the surface thereof.

(6) An electric connecting plane in which the solder layer of the clad material 30 is of such composition which is solderable to a current-conducting base when pressed against thereto under a heated condition.

(7) An electric connecting plane in which a waterproof insulating or conductive anti-corrosive paint layer is provided to surround the edges of a clad material bonded to a current-conducting base integrally therewith.

As can be understood from the foregoing detailed description, the present invention is advantageous in that, since the clad material, which is previously prepared by integrally cladding the surface conductive layer, intermediate conductive layer and solder layer, can be bonded to the current-conducting base by merely pressing it under connecting plane at a cheap price which is simple in production, easy in mounting and small in electric resistance at the contacting surface thereof.

Another advantage of the present invention is that it is possible to provide an electric connecting plane which is durable for a prolonged period of service with no fear of the resistance value at the contacting surface thereof varying or heat generating during conduction of a current therethrough, because generation of hydrogen gas or peeling of plating layers does not occur during production or use of said connecting plane, as has been encountered with the conventional plating layers.

Still another advantage of the present invention is that an electric connecting plane of the invention can be formed at any place by only providing a clad material of a desired size and heating means, and accordingly the electric connecting plane, upon occurrence of a faulty condition, can be repaired on the spot without bringing it back to the production plant, and thus is of high economical advantage.

We claim:

1. An electric connecting plane which comprises a current-conducting base composed of copper, zinc, aluminum or an alloy thereof, and a clad material comprising a surface conductive layer of silver or a silver alloy having a small contact resistance and a good corrosion resistance, an intermediate conductive layer of copper, a copper alloy, aluminum, or an aluminum alloy, having a good electric conductivity, cladded on said surface conductive layer, and a solder layer composed of a solder composition of 10% Zn-90% Sn, 10% Zn-5% Cd-85% Sn, 20% Zn-10% Cd-70% Sn, 41% Zn-8% Pd-15% Cd-36% Sn or 8 Zn-5% Al-87% Sn which is solderable to said current conducting base, cladded to said intermediate conductive layer, all of said layers being cladded one on another in superposed relation, and bonded to the surface of said base at the solder layer side thereof.

2. An electric connecting plane which comprises a current conducting base composed of copper, zinc, aluminum or an alloy thereof, a clad material comprising a surface conductive layer of silver or a silver alloy having a small contact resistance and good corrosion resistance, an intermediate conductive layer of copper, a copper alloy, aluminum, or an aluminum alloy having a good electric conductivity, cladded to said surface conductive layer and a solder layer composed of a solder composition of 10% Zn-90% Sn, 10% Zn-5% Cd-85% Sn, 20% Zn-10% Cd-70% Sn, 41% Zn-8% Pb-15% Cd-36% Sn or 8% Zn-5% Al-87% Sn which is solderable to said current-conducting base, cladded to said intermediate conductive layer, all of said layers being cladded one on another in superposed relation, and bonded to the surface of said base at the solder layer side thereof, and an insulating or conductive anti-corrosive paint layer of a material which is chemically inactive to both of said clad material and said current-conducting base and is waterproof.

References Cited

UNITED STATES PATENTS

| | | | |
|---|---|---|---|
| 2,916,815 | 12/1959 | Donkervoort | 29—197.5 |
| 2,947,069 | 8/1960 | Carlson | 29—197.5 |
| 3,321,828 | 5/1967 | Miller | 29—197 |
| 3,395,443 | 8/1968 | Polinko | 29—199 |
| 3,221,219 | 5/1965 | Emeis | 29—199 |
| 3,105,293 | 10/1963 | Skinner | 29—197 |
| 2,569,149 | 9/1951 | Brennan | 29—197 |
| 1,998,088 | 4/1968 | Langdon | 29—197 |
| 1,904,241 | 4/1933 | Kammerer | 29—199 |

HYLAND BIZOT, Primary Examiner

U.S. Cl. X.R.

29—197